United States Patent

Araki et al.

Patent Number: 5,661,449
Date of Patent: Aug. 26, 1997

[54] MAGNETIC MULTILAYER FILM, METHOD FOR MAKING, AND MAGNETORESISTANCE DEVICE

[75] Inventors: Satoru Araki, Chiba; Daisuke Miyauchi, Nagano, both of Japan

[73] Assignee: TDK Corporation, Tokyo, Japan

[21] Appl. No.: 520,723

[22] Filed: Aug. 29, 1995

[30] Foreign Application Priority Data

Aug. 29, 1994 [JP] Japan ................... 6-227347

[51] Int. Cl.⁶ .................................. H01L 43/00
[52] U.S. Cl. .................. 338/32 R; 360/113; 324/252; 324/207.21
[58] Field of Search .................. 338/32 R; 360/113; 324/252, 207.21

[56] References Cited

U.S. PATENT DOCUMENTS

| | | | |
|---|---|---|---|
| 4,103,315 | 7/1978 | Hempstead et al. | 360/113 |
| 4,841,399 | 6/1989 | Kltada et al. | 360/113 |
| 4,949,039 | 8/1990 | Gruenberg . | |
| 5,155,644 | 10/1992 | Kira et al. | 360/113 |
| 5,304,975 | 4/1994 | Saito et al. | 338/32 R |
| 5,313,186 | 5/1994 | Schuhl et al. | 338/32 R |
| 5,315,282 | 5/1994 | Shinjo et al. . | |
| 5,432,734 | 7/1995 | Kawano et al. | 360/113 |
| 5,462,796 | 10/1995 | Shinjo et al. | 428/332 |
| 5,474,833 | 12/1995 | Etienne et al. | 428/209 |

FOREIGN PATENT DOCUMENTS

| | | |
|---|---|---|
| 0 483 373 A1 | 5/1992 | European Pat. Off. . |
| 4-218982 | 8/1992 | Japan . |
| 6-122963 | 5/1994 | Japan . |

OTHER PUBLICATIONS

Magnetoresistance of Multilayers with Two Magnetic Components, H. Yamamoto, et al., *Journal of Magnetism and Magnetic Materials*, vol. 99, pp. 243–252, 1991.

Large Magnetoresistance of Field–Induced Giant Ferrimagnetic Multilayers, T. Shinjo, et al., *Journal of the Physical Society of Japan*, vol. 59, No. 9, Sep. 1990, pp. 3061–3064.

M.N. Baibich et al, Giant Magnetoresistance of (001)fe/(001)Cr Magnetic Superlattices, vol. 61, No. 21, (1988), pp. 2472–2474.

*Primary Examiner*—Teresa J. Walberg
*Assistant Examiner*—Karl Easthom
*Attorney, Agent, or Firm*—Oblon, Spivak, McClelland, Maier & Neustadt, P.C.

[57] ABSTRACT

A magnetic multilayer film having magnetoresistance (MR) is prepared by alternately depositing first and second magnetic layers while interposing a non-magnetic metal layer therebetween. The number of the first magnetic layers N1 and the number of the second magnetic layers N2 having greater coercivity than the first magnetic layers are in the range: $2 \leq N1 \leq 4$ and $N2=N1-1$. The first magnetic layer has a thickness t1 of 10–80 Å, second magnetic layer has a thickness t2 of 20–90 Å, and non-magnetic metal layer has a thickness t3 of 20–90 Å. The magnetic multilayer film comprising a less number of layers has a great MR ratio, a linear rise of an MR curve in proximity to zero magnetic field, and high sensitivity to a magnetic field. It also has a greater MR slope upon application of a high frequency magnetic field in proximity to zero magnetic field and withstands high temperatures. The magnetic multilayer film is used as a magneto-sensitive section to provide high performance MR devices.

14 Claims, 5 Drawing Sheets

MEDIUM SIDE

MEDIUM SIDE

MAGNETIC MULTILAYER FILM, METHOD FOR MAKING, AND MAGNETORESISTANCE DEVICE

BACKGROUND OF THE INVENTION

1. Field of the Invention

This invention relates to a magnetoresistance device capable of reading a small magnetic field strength change as a greater electrical resistance change signal, a magnetic multilayer film suitable for use therein, and a method for preparing the magnetic multilayer film. The term "magnetoresistance" is often abbreviated as MR, hereinafter.

2. Prior Art

There are growing demands for increased sensitivity of magnetic sensors and increased density of magnetic recording. Researchers strive for the development of magnetoresistance effect type magnetic sensors (simply referred to as MR sensors, hereinafter) and magneto-resistance effect type magnetic heads (simply referred to as MR heads, hereinafter). Both MR sensors and MR heads are MR devices for measuring the strength of a magnetic field applied thereacross by utilizing the principle that a reading sensor portion of MR material changes its electric resistance in response to an external magnetic field. The MR material detects the strength of an external magnetic field itself. Unlike inductive magnetic heads, the MR heads produce outputs which do not depend on their speed relative to magnetic recording media, ensuring high outputs upon reading of high density magnetic recording signals. The MR sensors have the advantage of high sensitivity.

Conventional MR heads using magnetic materials such as $Ni_{0.8}Fe_{0.2}$ (Permalloy) and NiCo as MR material have less enough sensitivity to read ultrahigh density record of the order of several GBPI since their percent MR ratios are low.

Attention is now paid to artificial superlattices having the structure in which thin films of metal having a thickness of an atomic diameter order are periodically stacked since their behavior is different from bulk metal. One of such artificial superlattices is a magnetic multilayer film having ferromagnetic metal thin films and non-magnetic metal thin films alternately deposited on a substrate. Heretofore known are magnetic multilayer films of iron-chromium and cobalt-copper types. Among them, the iron-chromium (Fe/Cr) type was reported to exhibit a MR ratio in excess of 40% at cryogenic temperature (4.2K) (see Phys. Rev. Lett., Vol. 61, page 2472, 1988). This artificial superlattice magnetic multilayer film, however, is not commercially applicable as such because the external magnetic field at which the MR ratio becomes maximum (that is, operating magnetic field strength) is as high as ten to several tens of kilooersted (kOe). Additionally, there have been proposed artificial superlattice magnetic multilayer films of Co/Ag, which require too high operating magnetic field strength.

Under these circumstances, a ternary artificial superlattice magnetic multilayer film having two types of magnetic layers having different coercive forces deposited with a non-magnetic layer interposed therebetween was proposed as exhibiting a giant MR change due to induced ferrimagnetism. Regarding such magnetic multilayer films, the following articles and patents are known.

(a) T. Shinto and H. Yamamoto, Journal of the Physical Society of Japan, Vol. 59 (1990), page 3061.

Described is a magnetic multilayer film of [Cu(x)—Co(y)—Cu(x)—NiFe(z)]xN wherein x, y and z represent the thickness in angstrom of the associated layer and N is the number of recurring units of Cu—Co—Cu—NiFe (the same applies hereinafter) wherein (x, y, z, N)=(50, 30, 30, 15). It produced an MR ratio of 9.9% at a maximum applied magnetic field of 3 kOe and about 8.5% at 500 Oe.

(b) H. Yamamoto, Y. Okuyama, H. Dohnomae and T. Shinjo, Journal of Magnetism and Magnetic Materials, Vol. 99 (1991), page 243

In addition to (a), this article discusses the results of structural analysis, changes with temperature of MR ratio and resistivity, changes with the angle of external magnetic field, a minor loop of MR curve, dependency on stacking number, dependency on Cu layer thickness, and changes of magnetization curve.

(c) U.S. Pat. No. 4,949,039 or JP-A 61572/1990

Ferromagnetic layers stacked alternately with non-magnetic intermediate layers align anti-parallel, exhibiting great magnetoresistance effect. A structure wherein an anti-ferromagnetic material is disposed adjacent one of the ferromagnetic layers is also disclosed.

(d) U.S. Pat. No. 5,315,282, EP 0 483 373 A1 or JP-A 218982/1992

Disclosed is a magnetic multilayer film having two types of magnetic layers having different coercive forces stacked through an intervening non-magnetic layer. An exemplary structure includes a Ni-Fe layer of 25 Å or 30 Å thick, an intervening Cu layer, and a Co layer of 25 Å or 30 Å thick.

(e) JP-A 122963/1994

Disclosed is a magnetic multilayer film having two types of magnetic layers having different coercive forces stacked through an intervening non-magnetic layer. By controlling the squareness ratio of the two magnetic layers, the slope of an MR curve at zero magnetic field is increased and the MR effect at high frequency is improved.

As compared with Fe/Cr, Co/Cu and Co/Ag, these field-induced ferrimagnetic multilayer films are inferior in the magnitude of MR ratio, but experience a rapid change of MR ratio under an applied magnetic field of less than several tens of oersted. They are thus effective MR head materials coping with a recording density of about 1 to 100 Gbits per square inch. While MR heads are required to operate under a magnetic field at a high frequency of at least 1 MHz for high density writing/reading, the magnetic multilayer film described in (e) is fully practical due to its improved MR effect at high frequency.

For increased sensitivity, the MR head has the so-called shielded structure wherein a magnetic multilayer film or Permalloy serving as a magneto-sensitive section is interposed between a pair of soft magnetic layers with an non-magnetic layer interposed therebetween. The distance between the pair of soft magnetic layers, known as a shield length, is very important. The shield length must be reduced as the recording density increases. However, in conventional MR heads using Permalloy in the magneto-sensitive section, the magneto-sensitive section has an increased total thickness because a shunt layer and a soft film bias layer are added to the Permalloy. This prevents the shield length from being reduced, leaving a problem. In MR heads using a magnetic multilayer film having a great slope of a MR curve at zero magnetic field as described in (e), the shield length cannot be reduced if there is a large number of recurring units.

The shield length may be reduced by reducing the number of recurring units N in a multilayer structure. In the above-referred article (b), Journal of Magnetism and Magnetic Materials, Vol. 99 (1991), pp. 243–252, FIG. 9 is a diagram of MR ratio at RT as a function of stacking number in a multilayer, which contains some examples wherein the number of recurring units N is 3 or less. In these examples, however, the percent MR ratio is as low as 4% at N=3 and 1.2% at N=1. As seen from these examples, prior art field-induced ferrimagnetic multilayer films have the problem that if the number of recurring units N is reduced in order to reduce the shield length, the percent MR ratio is concomitantly reduced. Even with the magnetic multilayer films described in (e), where the number of recurring units N is small, it is difficult to provide satisfactory MR characteristics and the slope of a MR curve is reduced especially under a high frequency magnetic field.

Since a complex laminate structure is used in MR heads or the like, patterning and flattening steps require heat treatment such as baking and curing of resist material, which in turn, requires heat resistance at temperatures of about 300° C. However, prior art artificial superlattice magnetic multilayer films tend to deteriorate by such heat treatment, and lose heat resistance especially when the number of recurring units N is small.

SUMMARY OF THE INVENTION

An object of the present invention is to provide a magnetic multilayer film which includes a smaller number of stacked magnetic layers, and exhibits a greater percent MR ratio, a linear rise of MR ratio in proximity to zero magnetic field, for example, under an applied magnetic field between −10 Oe and +10 Oe, a high magnetic field sensitivity, a greater slope of a MR curve under a high frequency magnetic field applied in proximity to zero magnetic field, and a higher heat resistant temperature.

Another object of the present invention is to provide a high performance MR device, typically a MR head capable of reading high density record information using the magnetic multilayer film.

According to the present invention, there is provided a magnetic multilayer film comprising a first magnetic layer and a second magnetic layer having a greater coercive force than the first magnetic layer. The first and second magnetic layers are alternately stacked with a non-magnetic metal layer intervening therebetween. The number of the first magnetic layers N1 and the number of the second magnetic layers N2 fall in the range: $2 \leq N1 \leq 4$ and $N2=N1-1$. The first magnetic layer has a thickness t1 of 10 to 80 Å, the second magnetic layer has a thickness t2 of 20 to 90 Å, and the non-magnetic metal layer has a thickness t3 of 20 to 90 Å.

In preferred embodiments, each first magnetic layer has a magnetization M1 and each second magnetic layer has a magnetization M2 wherein $0.3 \leq M1/M2 \leq 0.8$; the first magnetic layer has an anisotropic magnetic field Hk of 3 to 20 Oe.

With respect to layer compositions, the present invention favors that the first magnetic layer comprises a magnetic metal containing at least 70% by weight of a composition of the formula: $(Ni_xFe_{1-x})_{1-y}Co_y$ wherein x and y representative of weight ratios are $0.7 \leq x \leq 0.9$ and $0 \leq y \leq 0.3$;

the second magnetic layer comprises a magnetic metal containing at least 70% by weight of a composition of the formula: $(Co_zNi_{1-z})_wFe_{1-w}$ wherein z and w representative of weight ratios are $0.4 \leq z \leq 1.0$ and $0.5 \leq w \leq 1.0$, or a magnetic metal containing at least 70% by weight of at least one element selected from the group consisting of cobalt, iron, and nickel and having added thereto at least one element selected from the group consisting of Pt, Pt, Tb, Gd, Dy, Sm, Nd, Eu, and P; and the nonimagnetic metal layer comprises a non-magnetic metal containing at least one element selected from the group consisting of gold, silver, and copper.

The magnetic multilayer film according to one preferred embodiment, upon application of a DC magnetic field, provides a magnetoresistance curve having a maximum slope of at least 0.2%/Oe in a magnetic field in the range between −10 Oe and +10 Oe.

The magnetic multilayer film according to another preferred embodiment, upon application of an AC magnetic field at a frequency of 1 MHz and an amplitude of 10 Oe over the range between −20 Oe and +20 Oe, provides a magneto-resistance curve having a maximum slope of at least 0.1%/Oe.

In another aspect, the present invention provides a method for preparing a magnetic multilayer film as defined above comprising the steps of forming the first magnetic layer, the second magnetic layer and the non-magnetic metal layer, wherein during the step of forming the first magnetic layer, a magnetic field is applied in one in-plane direction of the first magnetic layer.

Preferably, the steps of forming the first magnetic layer, the second magnetic layer and the non-magnetic metal layer are achieved by effecting evaporation such that particles being deposited may possess an energy of 0.01 to 10 eV. Also preferably, the steps of forming the first magnetic layer, the second magnetic layer and the non-magnetic metal layer are achieved by effecting evaporation in an atmosphere of up to $10^{-8}$ Torr.

The method may further include the step of heat treating the resultant magnetic multilayer film at a temperature of up to 300° C. Also preferably, the resultant magnetic multilayer film is heat treated at a temperature of up to 400° C. In an atmosphere of up to $10^{-7}$ Torr.

In a further aspect, the present invention provides a magnetoresistance device comprising a magnetic multilayer film as defined above as a magneto-sensitive section. The magnetoresistance device does not need a bias magnetic field applying mechanism.

In a field-induced ferrimagnetic multilayer film having magnetic layers stacked with intervening non-magnetic metal layers, it is still insufficient for achieving the above-mentioned objects to limit such factors as coercivity difference and squareness ratio as described in the above-referred articles and patents. The present invention achieves the above-mentioned objects by taking advantage of the soft magnetic properties of the first magnetic layers with lower coercivity and optimizing the arrangement of two types of magnetic layers.

Since the number of second magnetic layers is smaller by one than the number of first magnetic layers, the overall thickness of the magnetic multilayer film according to the present invention is smaller than that of the previously mentioned multilayer film wherein the number of recurring units N is 4 or less. Since the number of first magnetic layers with lower coercivity is greater than the number of second magnetic layers, the above-mentioned objects are achieved even when the overall number of magnetic layers stacked is small. In all the previously mentioned field-induced ferrimagnetic multilayer films, two types of magnetic layers having different coercive forces are used in an identical number. In the previous field-induced ferrimagnetic multilayer films, the construction that magnetic layers with lower coercivity are stacked in a more number was not contemplated. It was, of course, unknown that such a construction is effective especially when a smaller number of magnetic layers are stacked.

A MR head using the magnetic multilayer film of the invention as a magneto-sensitive section can produce an output voltage which is about 3 times greater than MR heads using conventional magnetic multilayer films. Accordingly the MR head of the invention ensures high reliability readout and can read out signals magnetically recorded at a ultrahigh density of 1 Gbit per square inches or more.

BEST MODE FOR CARRYING OUT THE INVENTION

In the magnetic multilayer film according to the present invention, first and Second magnetic layers having different coercive forces are disposed adjacent to each other with a non-magnetic metal layer interposed therebetween. The two types of magnetic layers must have different coercive forces because the principle of the invention is that conduction electrons are subject to spin-dependent scattering to increase electrical resistance as adjacent magnetic layers are offset in the direction of magnetization, and the resistance reaches maximum when the adjacent magnetic layers have opposite directions of magnetization.

Figure 2:
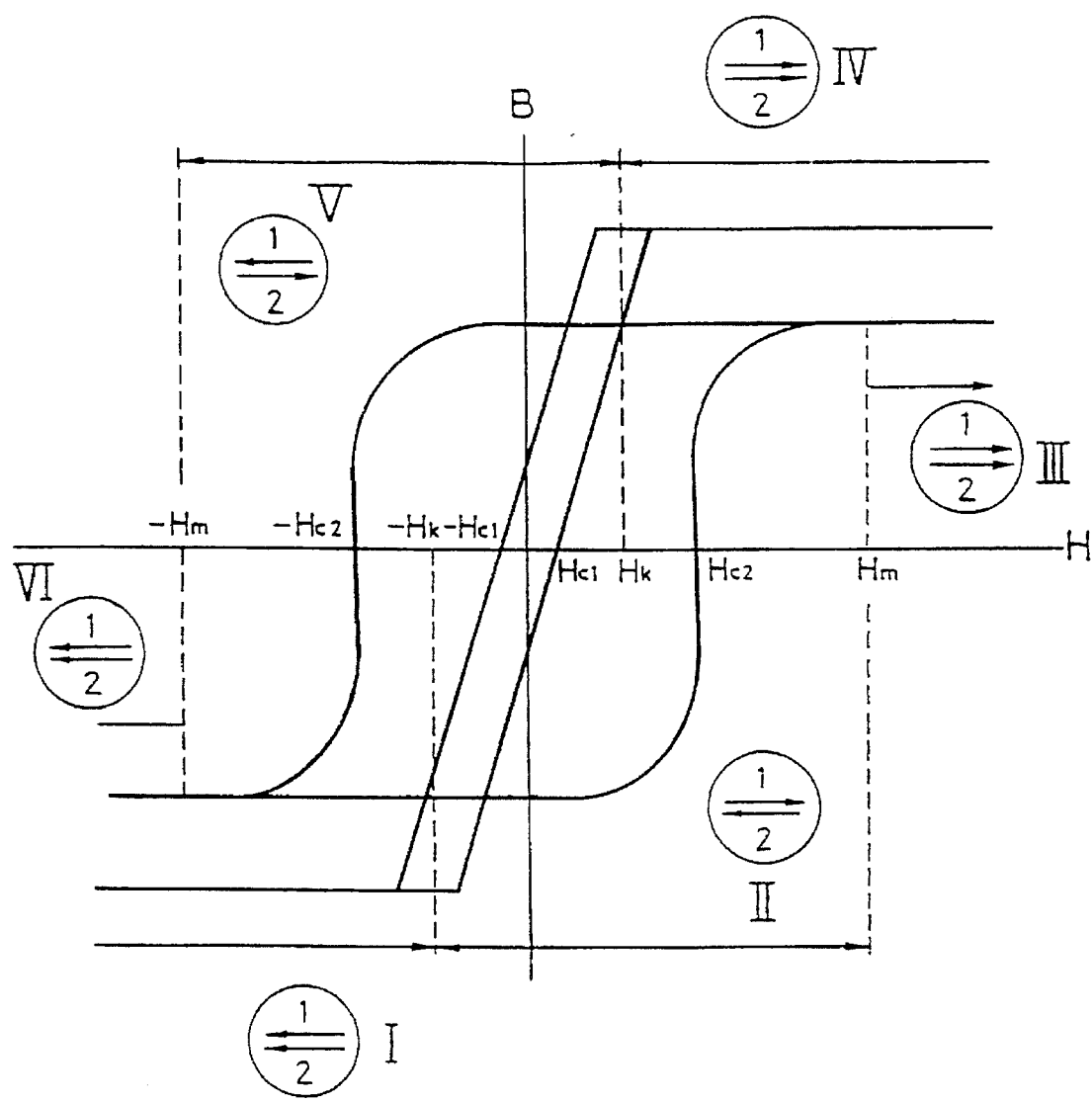
FIG. 2 is a diagram showing exemplary B-H curves for explaining the principle of the invention.

Now, the function of the magnetic multilayer film according to the present invention will be understood from the following description of the relationship of an external magnetic field to the coercive force and magnetization direction of respective magnetic layers of a ternary magnetic multilayer film. For the sake of brevity of description only, reference is made to a structure having only one first magnetic layer and one second magnetic layer. Assume that first and second magnetic layers (1) and (2) have different coercive forces $Hc_1$ and $Hc_2$ ($0<Hc_1<Hc_2$), respectively, the first magnetic layer (1) has an anisotropic magnetic field Hk, and the magnetization of the second magnetic layer (2) is saturated at an external magnetic field Hm as shown in FIG. 2. At the initial, an external magnetic field H is applied wherein H<-Hm. The first and second magnetic layers (1) and (2) have magnetization directions oriented in a negative (−) direction same as H. Then the external magnetic field is increased to region I of H<-Hk where both the magnetic layers have magnetization directions oriented in one direction. As the external magnetic field is increased to region II of -Hk<H<Hk, magnetic layer (1) partially starts reversing its magnetization direction so that the magnetization directions of magnetic layers (1) and (2) may include opposite components. The magnetization directions of magnetic layers (1) and (2) are in substantially complete anti-parallelism in the range of Hk<H<Hc2. When the external magnetic field is further increased to region III of Hm<H, magnetic layers (1) and (2) have magnetization directions aligned in a positive (+) direction.

Now, the external magnetic field H is reduced. In region IV of Hk<H, the magnetic layers (1) and (2) have magnetization directions still aligned in a positive (+) direction. In region V of -Hk<H<+Hk, the magnetic layer (1) starts reversing its magnetization direction in one direction so that the magnetization directions of magnetic layers (1) and (2) may include opposite components. Subsequently in region VI of H<-Hm, the magnetic layers (1) and (2) have magnetization directions aligned in one direction again. In the regions II and V where the magnetic layers (1) and (2) have opposite magnetization directions, conduction electrons are subject to spin-dependent scattering, resulting in an increased resistance. In the zone of -Hk<H<Hk in region II, magnetic layer (2) undergoes little magnetization reversal, but magnetic layer (1) linearly increases its magnetization, the proportion of conduction electrons subject to spin-dependent scattering is gradually increased in accordance with a magnetization change of magnetic layer (1). By selecting a low Hc material such as $Ni_{0.8}Fe_{0.2}$ ($Hc_1$=several Oe) as the first magnetic layer (1), imparting appropriate Hk thereto and selecting a somewhat high Hc, high squareness ratio material such as Co ($Hc_2$=several tens of Oe) as the second magnetic layer (2), for example, there is obtained an MR device exhibiting a linear MR change and a great MR ratio in a low external magnetic field in the range of several oersteds to several tens of oersted near or below Hk.

Figure 1:
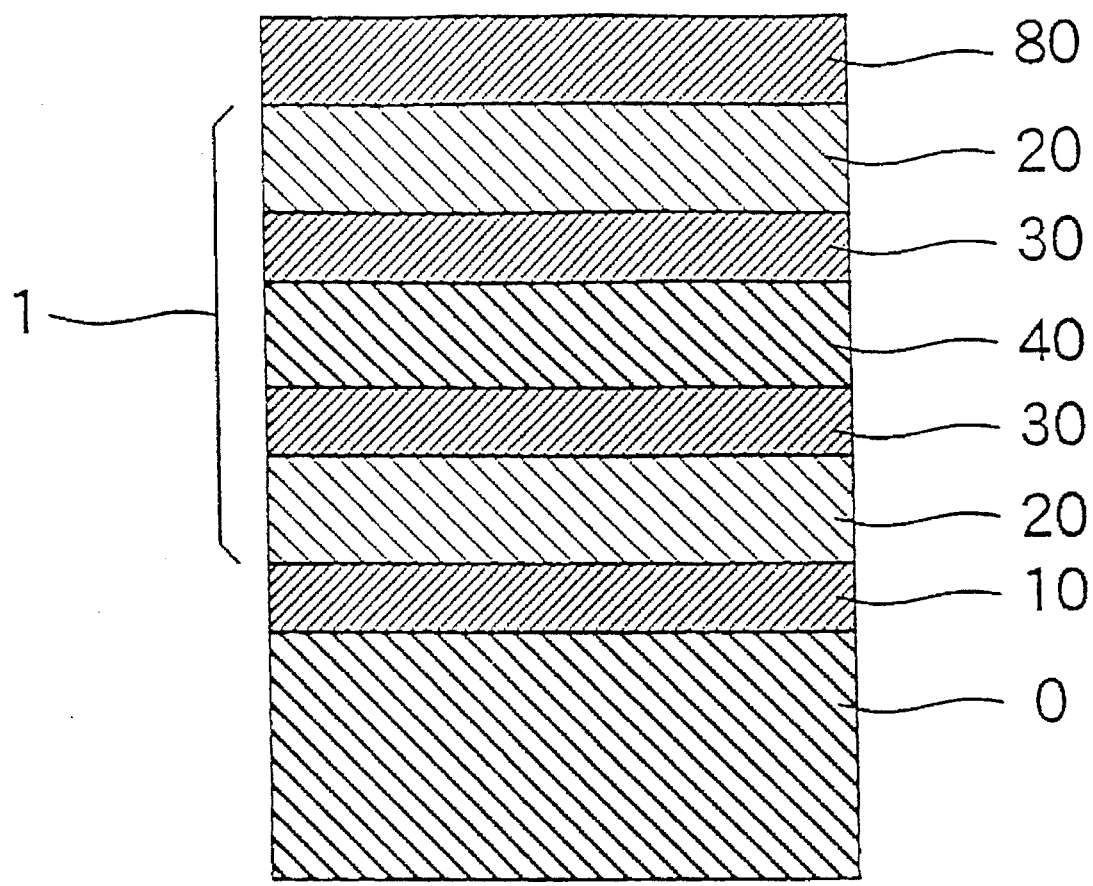
FIG. 1 is a cross-sectional view of a magnetic multilayer film according to the invention.

Referring to FIG. 1, there is shown in cross section a magnetic multilayer film 1 according to one embodiment of the invention. The magnetic multilayer film 1 is formed on a metal underlying layer 10 on a substrate 0 while a protective layer 80 is formed on the magnetic multilayer film 1. The magnetic multilayer film 1 includes a lower first magnetic layer 20, a lower non-magnetic metal layer 30, a second magnetic layer 40 having a greater coercive force than the first magnetic layer, an upper non-magnetic metal layer 30, and an upper first magnetic layer 20 stacked from bottom to top in the described order. It is understood that a non-magnetic metal layer may intervene between the metal underlying layer 10 and the lower first magnetic layer 20.

In the magnetic multilayer film of the invention, provided that N1 is the number of the first magnetic layers having a smaller coercive force and N2 is the number of the second magnetic layers having a greater coercive force, N1 and N2 fall in the range:

$$2 \leq N1 \leq 4, \text{ preferably } 2 \leq N1 \leq 3 \text{ and } N2 = N1-1.$$

Under an external magnetic field having a strength of the order of signal magnetic field, the second magnetic layer having a greater coercive force does not change the direction of spin and has a magnetic spin structure fixed in a certain direction. On the other hand, the first magnetic layer having a smaller coercive force does change the direction of spin even under a weak external magnetic field having a strength of the order of signal magnetic field. As a consequence, the magnetic multilayer film exhibits a greater resistance change. Since the number of first magnetic layers susceptible to spin rotation under a weak magnetic field is more, the magnetic multilayer film according to the invention provides a greater MR change although it is thin. More particularly, since conduction electrons undergo most efficient scattering by magnetic spin while they flow through the magnetic multilayer film, a great MR effect is obtained as compared with prior art magnetic multilayer films wherein N1=N2. In general, the MR effect is reduced as the number of magnetic layers stacked is reduced. For example, the magnetic multilayer film described in the above-referred article (b) has an MR ratio as low as 4% for N1=N2=3 and 1.2% for N1=N2=1 provided that the numbers of magnetic layers are expressed by N1 and N2 as in the present invention. In contrast to article (b) wherein N1=N2, the present invention ensures a greater MR ratio despite a smaller number of magnetic layers by setting N2=N1−1. As will be described later, by inducing an anisotropic magnetic field Hk of 1 to 20 Oe in the first magnetic layer having a smaller coercive force, there is obtained a magnetic multilayer film providing a MR curve with a greater slope in proximity to zero magnetic field and having a satisfactory MR effect at high frequency. If N1 is more than 4, no outstanding effects are achieved despite the setting: N2=N1−1.

The long period structure can be observed by taking a small angle X-ray diffraction pattern where primary and secondary peaks corresponding to recurring periodicities appear.

In the invention, the respective magnetic layers have coercive forces Hc which may be suitably selected in the range of, for example, 0.001 Oe to 10 kOe, especially 0.01 to 1000 Oe, depending on the strength of an applied external magnetic field and the MR ratio required for the device associated therewith. The ratio in coercive force between first and second magnetic layers, $Hc_2/Hc_1$ is preferably from 1.2:1 to 100:1, especially from 1.5:1 to 100:1, more preferably from 2:1 to 80:1, especially from 3:1 to 60:1, most preferably from 5:1 to 50:1, especially from 6:1 to 30:1. Outside the range, a higher $Hc_2/Hc_1$ ratio would result in a broader MR curve whereas a lower ratio leads to a smaller difference between coercive forces, failing to take advantage of anti-parallelism.

Coercive force Hc is measured as follows because it is impossible to directly measure the magnetic properties of magnetic layers in a magnetic multilayer film. For example, first magnetic layers to be measured for Hc are deposited by evaporation alternately with non-magnetic metal layers until the total thickness of the magnetic layers reaches about 200 to 400 Å. The resulting sample is measured for magnetic properties. It is to be noted that the thickness of magnetic layers, the thickness and composition of non-magnetic metal layers, and their deposition method are the same as in a magnetic multilayer film to be examined.

In the magnetic multilayer film of the invention, there are included a plurality of first magnetic layers and one or more second magnetic layers. For each type, a plurality of magnetic layers have substantially the same coercive force because their composition and deposition method are generally unchanged. Since only $Hc_1<Hc_2$ is required in the magnetic multilayer film of the invention, a plurality of first magnetic layers need not necessarily have an identical coercive force $Hc_1$ and similarly, a plurality of second magnetic layers need not necessarily have an identical coercive force $Hc_2$.

In order to provide an MR curve having good linearity across zero magnetic field and improved heat resistance, the respective magnetic layers should preferably have controlled squareness ratio SQ=residual magnetization Mr/saturated magnetization Ms. The first magnetic layer should preferably have a squareness ratio $SQ_1$ of $0.01 \leq SQ_1 \leq 0.5$, more preferably $0.01 \leq SQ_1 \leq 0.4$, most preferably $0.01 \leq SQ_1 \leq 0.3$. The second magnetic layer should preferably have a squareness ratio $SQ_2$ of $0.7 \leq SQ_2 \leq 1.0$. since the first magnetic layer governs the rise of MR change in the vicinity of zero magnetic field, its squareness ratio $SQ_1$ is preferably as small as possible. More particularly, with smaller $SQ_1$, magnetization will gradually rotate and anti-parallelism will gradually increase in the vicinity of zero magnetic field, resulting in a linear MR curve across zero magnetic field. With $SQ_1$ larger than 0.5, it is difficult to provide a linear MR change. The lower limit of $SQ_1$ from the manufacturing aspect is about 0.01. The second magnetic layer should preferably have a squareness ratio $SQ_2$ close to 1 in the vicinity of zero magnetic field. With a squareness ratio $SQ_2$ of 0.7 or higher, the rise of MR change in the vicinity of zero magnetic field becomes sharp and a great MR ratio is obtainable. Preferably $SQ_2/SQ_1$ is between 2 and 100, especially between 2 and 50.

The composition of the first magnetic layer with smaller coercive force is not critical although it preferably comprises a magnetic metal containing at least 70% by weight of a composition of the formula:

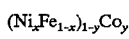

wherein x and y representative of weight ratios of Ni and Co are $0.7 \leq x \leq 0.9$ and $0 \leq y \leq 0.3$. Preferably the first magnetic layer consists essentially of this magnetic metal. Use of this magnetic metal provides magnetic layers with a smaller coercive force and satisfactory soft magnetic properties. As a result, a MR change curve having a sharp rise and high magnetic field sensitivity are available. With x and y outside the range, the resulting magnetic layer has a greater coercive force, failing to achieve a high magnetic field sensitivity.

Also the composition of the second magnetic layer with greater coercive force is not critical although it preferably comprises a magnetic metal containing at least 70% by weight of a composition of the formula:

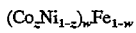

wherein z and w representative of weight ratios of Co and Co-Ni are $0.4 \leq z \leq 1.0$ and $0.5 \leq w \leq 1.0$. Preferably the second magnetic layer consists essentially of this magnetic metal. Use of this magnetic metal provides second magnetic layers with satisfactory magnetic properties relative to the first magnetic layer. Examples of this magnetic metal include Co, CoFe, CoNi, and CoFeNi. For the second magnetic layer, use may also be made of a magnetic metal containing at least 70% by weight of at least one element selected from Co, Fe, and Ni, and further containing at least one subordinate element selected from the group consisting of Pr, Pt, Tb, Gd, Dy, Sm, Nd, Eu, and P. Addition of the subordinate element increases the coercive force of the second magnetic layer, stabilizes a linear rise portion of a MR change curve at zero magnetic field, and increases the stability against external disturbing magnetic field. Examples of the magnetic metal having such a subordinate element added include CoPt, CoP, CoNiP, CoGd, CoTb, CoDy, CoSm, CoPr, CoNd, FeTb, FeGd, FeDy, FeNd, FeSm, FeEu, FeCoTb, FeCoPt, and FeCoGdDy.

The non-magnetic metal layer is preferably formed of a conductive metal for effectively conduction electrons, typically a non-magnetic metal containing at least one element selected from gold (Au), silver (Ag), and copper (Cu). Preferably the sum of Au, Ag, and Cu occupies at least 60% by weight of the non-magnetic metal layer.

For application to MR heads, the respective layers of the magnetic multilayer film should preferably be as thin as possible because the shield length is reduced to allow for reading-out of high density signals. However, if too thin, soft magnetic, ferromagnetic or anti-ferromagnetic properties required for the respective layers are lost and heat resistance is poor. While the present invention is characterized by a reduced number of magnetic layers, no satisfactory MR effect is accomplished unless the respective magnetic layers perform well. Since the magnetostatic bond and direct exchange interaction between respective layers are substantially reduced in a magnetic multilayer film having a small number of magnetic layers, the magnetic layers may be made thick as compared with a magnetic multilayer film having a large number of magnetic layers and an increased total thickness. If the respective magnetic layers are too thick, however, the probability of conduction electrons being scattered becomes low at a certain relative angle between spins of the two types of magnetic layers and the MR effect is rather reduced. Increased resistivity is inconvenient for multilayer application. If a non-magnetic metal layer is too thick, most conduction electrons pass through this non-magnetic metal layer and a smaller proportion of conduction electrons are scattered in magnetic layers, resulting in a lower percent MR ratio. Conversely, if a non-magnetic metal layer is too thin, a greater magnetic interaction occurs between magnetic layers, with the likelihood of the two magnetic layers having different magnetization directions being lost. For this and other reasons, the present invention limits the thickness of the respective layers. The first magnetic layer has a thickness t1, the second magnetic layer has a thickness t2, and the non-magnetic metal layer has a thickness t3 wherein 10 Å≦t1≦80 Å, 20 Å≦t2≦90 Å, and 20 Å≦t3≦90 ÅA, preferably 20 Å≦t1, t2, t3≦80 Å, more preferably 20 Å≦t1, t2, t3≦70 Å.

Understandably, the thickness of magnetic layers and non-magnetic layers can be measured by means of a transmission electron microscope or scanning electron microscope or by Auger electron spectroscopy. The crystal structure of layers can be observed by X-ray diffraction or high speed electron diffraction analysis.

It is the spins of both the first and second magnetic layers that contributes to scattering of conduction electrons. Most efficient scattering occurs when both the spins are of substantially the same magnitude, that is, when the total quantity of magnetization a number (N1) of first magnetic layers possess is approximately equal to the total quantity of magnetization a number (N2) of second magnetic layers possess. Because of N1>N2, more efficient scattering occurs when the quantity of magnetization of a single first magnetic layer is smaller than the quantity of magnetization of a single second magnetic layer. More particularly, more efficient scattering of conduction electrons occurs when the respective magnetic layers are preferably adjusted in thickness so as to meet 0.3≦M1/M2≦0.8, more preferably 0.4=M1/M2≦0.8 provided that a single first magnetic layer has a quantity of magnetization M1 and a single second magnetic layer has a quantity of magnetization M2. With this adjustment, the region of the magnetic multilayer film which does not contribute to scattering of conduction electrons is reduced. Understandably, M1/M2 is obtained by multiplying the magnetization (magnetic moment per unit volume) of each magnetic layer by its thickness and dividing the product for the first magnetic layer by the product for the second magnetic layer. The magnetization of each magnetic layer is measured using the above-mentioned sample for coercive force measurement. Where all of the first magnetic layers are not equal in thickness, the magnetization per layer is determined using an average thickness of the first magnetic layers. This is also true for the second magnetic layers.

The first magnetic layer should preferably be imparted an anisotropic magnetic field Hk of 3 to 20 Oe, more preferably 3 to 16 Oe, most preferably 3 to 12 Oe. Such Hk can be imparted to the first magnetic layer by forming the layer while applying an external magnetic field in one direction in its plane. If the anisotropic magnetic field Hk of the first magnetic layer is less than 3 Oe, it is approximate to the coercive force, and the multilayer film would not provide an MR curve which is linear across zero magnetic field or satisfy the MR head requirements. If the first magnetic layer's Hk is more than 20 Oe, the multilayer film would have a reduced MR slope so that MR heads constructed therefrom will provide low outputs and low resolution. The external magnetic field used for imparting Hk is preferably of 10 to 300 Oe. An external magnetic field of less than 10 Oe would be difficult to impart the desired Hk whereas an external magnetic field of more than 300 Oe would provide no further merits in imparting Hk and requires a larger coil to generate it, leading to an increased expense and less efficiency. An external magnetic field may be applied only when the first magnetic layer is formed. Alternatively, an external magnetic field may be applied throughout the process for the manufacture of a magnetic multilayer film including formation of other layers. In the former case wherein an external magnetic field is applied only during formation of the first magnetic layers, the system may be provided with means capable of applying a magnetic field at controlled timing, for example, an electromagnet. Understandably, the anisotropic magnetic field can be measured using the above-mentioned sample for coercive force measurement.

In the magnetic multilayer film of the invention, a rise portion of the MR curve preferably has a gradient (or MR slope) of at least 0.2%/Oe, more preferably at least 0.25%/Oe, especially 0.3 to 1.0%/Oe in an external magnetic field between −10 Oe and +10 Oe. The MR slope is obtained by measuring an MR to depict an MR curve, determining differential values therefrom, and determining a maximum differential value over the magnetic field range between −10 Oe and +10 Oe. It is to be noted that the MR ratio of a magnetic multilayer film under a DC magnetic field having a strength H is calculated as $$(\rho_H - \rho_{sat})/\rho_{sat} \times 100\%$$

wherein $\rho_H$ is the resistivity under an external magnetic field of strength H and $\rho_{sat}$ is the resistivity when all the magnetic layers of the magnetic multilayer film are saturated in magnetization (that is, minimum resistivity). The $\rho_{sat}$ of the magnetic multilayer film according to the invention is determined in an external magnetic field over the range between −300 Oe and +300 Oe.

Also in the magnetic multilayer film of the invention, the MR hysteresis curve obtained by applying a magnetic field of about −300 Oe for once saturating all the magnetic layers and sweeping a magnetic field in the range between −20 Oe and +20 Oe to depict a minor loop can have a maximum width of up to 8 Oe, especially 0 to 6 Oe.

Further, the slope of a MR curve (or high-frequency MR slope) obtained by measuring an MR ratio in an alternating magnetic field having an amplitude of 10 Oe and a frequency of 1 MHz and determining a gradient thereof between −20 Oe and +20 Oe can be at least 0.1%/Oe, more preferably at least 0.15%/Oe, most preferably 0.2 to 1.0%/Oe. That is, the desirable high-frequency MR slope can be obtained independent of whether a DC bias magnetic field in the range between −15 Oe and +15 Oe is applied or not. Then when the magnetic multilayer film is applied to MR heads for high density record reading, satisfactory performance is expectable. It is noted that the high-frequency MR slope is also a maximum of the differential values of a MR curve wherein the MR ratio is given by $$(\rho_H - \rho_{min})/\rho_{min} \times 100\%$$

wherein $\rho_{min}$ is a minimum resistivity upon application of a high-frequency magnetic field having an amplitude of 10 Oe.

The magnetic multilayer film can be formed by conventional methods such as ion beam sputtering, sputtering, evaporation, and molecular beam epitaxy (MBE) methods. Since the magnetic multilayer film of the invention has a magnetization structure of the field-induced ferrimagnetic type, layer deposition should be done so as to minimize the intermixing of elements between adjacent layers at each interface in a multilayer structure. To this end, evaporation is preferably carried out to form each layer such that particles being deposited may have an energy of 0.01 to 10 eV, more preferably 0.05 to 10 eV, preferably with a median energy of 0.1 to 8 eV, especially 0.1 to 6 eV. If the depositing particles have too much energy, substantial mixing of different elements can occur at the interface to form an alloy, failing to provide a significant MR effect of the induction ferrimagnetic type. If the depositing particles have too low energy, the resulting magnetic multilayer film would have low crystallinity and high resistivity, failing to provide a significant MR effect. Further preferably, evaporation is effected in a vacuum of up to $10^{-8}$ Torr. A magnetic multilayer film of quality can also be formed by a method other than evaporation, for example, by ion beam sputtering insofar as the energy of depositing particles is properly controlled.

The substrate on which the magnetic multilayer film is formed may be of glass, silicon, magnesium oxide (MgO), gallium arsenide (GaAs), ferrite, AlTiC and CaTiO.

Optionally the metal underlying layer is provided for the purposes of mitigating the difference in surface energy between the material of the magnetic multilayer film and the substrate material and improving the wetting therebetween for accomplishing a laminate structure having a flat interface over a wide area. The material of which the metal underlying layer is made is not critical and includes Cr, Ta, Hf, Cu, Au, Ag, Nb, and Zr and an alloy containing at least one of them. The metal underlying layer is generally about 10 to 100 Å thick.

The protective layer is provided for protecting and preventing oxidation of the magnetic multilayer film. The protective layer is generally constructed by various dielectric materials such as silicon nitride, silicon oxide, and aluminum oxide.

A process for manufacturing an MR head using the magnetic multilayer film according to the invention necessarily involves heat treatment such as baking, annealing and resist curing for patterning, flattening and the like. In general, a problem of heat resistance often arises with magnetic multilayer films which are referred to as artificial superlattices because they are constructed by thin layers. However, the magnetic multilayer film of the invention can withstand heat treatment of up to 300° C. and 2 hours by imparting a desirable anisotropic magnetic field to the first magnetic layers. Heat treatment is generally carried out in vacuum, inert gas atmosphere or air. Especially when heat treatment is carried out in a vacuum of up to $10^{-7}$ Torr, the magnetic multilayer film is minimized deterioration and tolerant to heat treatment of up to 400° C. By imparting an anisotropic magnetic field, any deterioration of MR effect by lapping and polishing is avoidable.

In general, MR heads using Permalloy include a shunt layer of Ti or the like or a bias magnetic field applying layer of high resistivity soft magnetic material such as CoZrMo and NiFeRh, both disposed adjacent the magneto-sensitive section. These layers constitute a bias magnetic field applying mechanism of shifting an MR curve of Permalloy to develop a linear region centering at zero magnetic field, which mechanism is referred to as shunt bias or soft film bias. Due to complexity, however, this mechanism becomes a factor of substantially reducing the yield of the manufacture process. Since the MR curve of the magnetic multilayer film according to the invention rises from the very vicinity to zero magnetic field, a linear region centering at zero magnetic field can be developed by self biasing resulting from current flow through the magnetic multilayer film and a Shift of the MR curve due to a diamagnetic field resulting from the pattern configuration. As a consequence, a need for a bias magnetic field applying mechanism is eliminated, leading to the advantages of an increased manufacturing yield, a shortened manufacturing time, and a cost reduction. Since the magneto-sensitive section is reduced in thickness due to the absence of a bias magnetic field applying mechanism, the resulting MR head has a reduced shield length, which is very effective for reducing the wavelength of signals for ultrahigh density recording.

Figure 3:
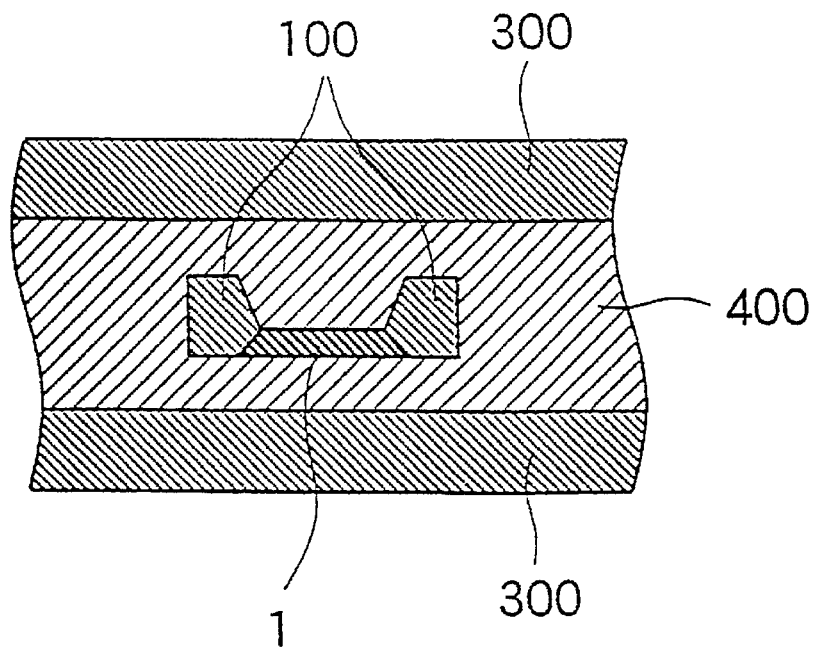
FIG. 3 is a fragmental cross-sectional view of a MR device using a magnetic multilayer film as a magneto-sensitive section according to one embodiment of the invention.

Referring to FIG. 3, there is illustrated one particular embodiment of the present invention wherein the magnetic multilayer film is applied to a magneto-sensitive section of an MR device such as MR head. The MR device shown in FIG. 3 includes a magnetic multilayer film 1 formed within a non-magnetic insulating layer 400 and a pair of electrodes 100 and 100 connected to opposite sides of the magnetic multilayer film 1 for conducting measuring electric current across the magnetic multilayer film 1. The electrodes 100 are usually formed of Cu, AG, Au, W, and Ta, for example. The non-magnetic insulating layer 400 is usually formed of oxides commonly used to form non-magnetic insulating layers, for example, $SiO_2$, SiO, and $Al_2O_3$. The non-magnetic insulating layer 400 and hence the magnetic multilayer film 1 is sandwiched between a pair of shields 300 and 300 of Sendust or Permalloy.

Figure 4:
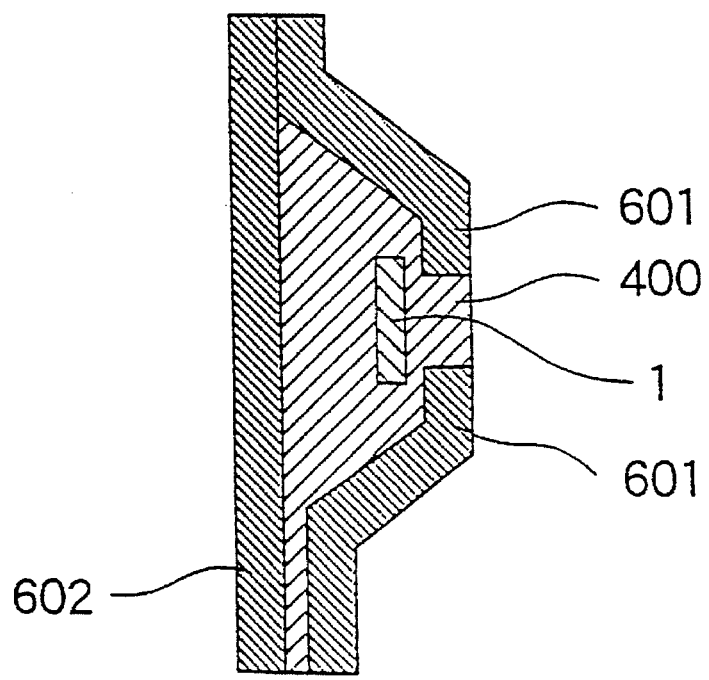
FIG. 4 is a fragmental cross-sectional view of a yoke type MR head using a magnetic multilayer film as a magneto-sensitive section according to another embodiment of the invention.

FIG. 4 illustrates another particular embodiment of the present invention wherein the magnetic multilayer film is applied to a magneto-sensitive section of a yoke type MR head. The magneto-sensitive section includes first and second yokes 601 and 602 which at one end are closely spaced from each other and opposed to a magnetic recording medium and at another end remote from the medium (upper end as viewed in FIG. 4) are disposed in contact. The first yoke. 601 consists of a lower yoke segment and an upper yoke segment which are not magnetically coupled. Disposed between the lower and upper yoke segments is a magnetic multilayer film 1 having an in-plane direction substantially aligned with the first and second yokes. A non-magnetic insulating layer 400 intervenes between the yokes and the magnetic multilayer film 1. The magnetic multilayer film 1 is provided with electrodes (not shown) for conducting electric current flow parallel to or perpendicular to the direction of a magnetic path generated by the yokes.

Figure 5:
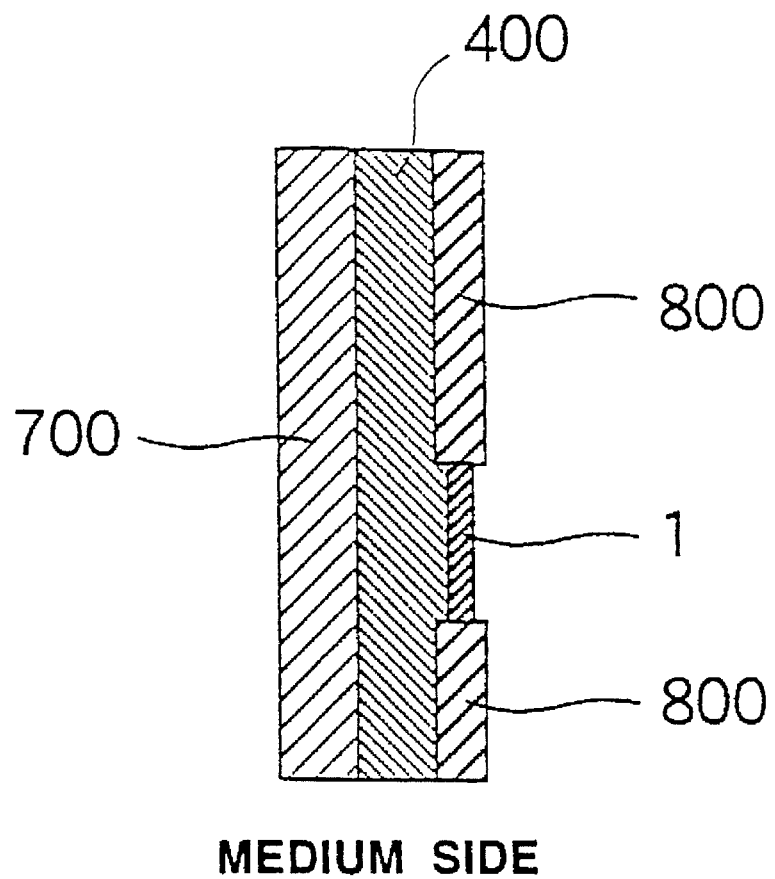
FIG. 5 is a fragmental cross-sectional view of a flux guide type MR head using a magnetic multilayer film as a magneto-sensitive section according to a further embodiment of the invention.

FIG. 5 illustrates a further particular embodiment of the present invention wherein the magnetic multilayer film is applied to a magneto-sensitive section of a flux guide type MR head. The magneto-sensitive section includes a high-resistivity flux guide layer 800 and a flux guide layer 700 disposed so as to face a magnetic recording medium at one end. The high-resistivity flux guide layer 800 consists of a high-resistivity flux guide layer lower segment and a high-resistivity flux guide layer upper segment, between which a magnetic multilayer film 1 intervenes. The magnetic multilayer film 1 has opposite ends in its in-plane direction magnetically coupled to the upper and lower high-resistivity flux guide layer segments. The magnetic multilayer film 1 is also provided with electrodes (not shown) for conducting electric current flow parallel to or perpendicular to the direction of a magnetic path. A non-magnetic insulating layer 400 intervenes between the flux guide layer 700 and the magnetic multilayer film 1 and high-resistivity flux guide layer 800. The flux guide layer 700 functions as a return guide for a magnetic flux passing past the magnetic multilayer film 1. Since the high-resistivity flux guide layer 800 is formed of a material having a higher resistivity than the magnetic multilayer film 1 by a factor of 3 or more, for example, CoZr, CoZrNb, NiFeRh, FeSiB, and CoZrMo, the measuring current across the magnetic multilayer film 1 does not flow across the high-resistivity flux guide layer 800 in a substantial sense. On the other hand, since the high-resistivity flux guide layer 800 is magnetically coupled to the magnetic multilayer film 1, a signal magnetic field induced in the high-resistivity flux guide layer 800 lower segment reaches the magnetic multilayer film 1 without a loss of its strength. In the illustrated embodiment, the flux guide layer 700 is disposed on only one side of the magnetic multilayer film 1 although a pair of flux guide layers may be provided so as to sandwich the magnetic multilayer film 1 therebetween. Also, the flux guide layer 700 may be connected to the high-resistivity flux guide layer upper segment at the end remote from the medium (upper end as viewed in FIG. 5).

Optionally the magnetic multilayer film of the invention may be provided with a shunt layer or bias magnetic field applying layer although they are unnecessary as mentioned previously.

EXAMPLE

Examples of the present invention are given below by way of illustration and not byway of limitation.

Example 1

A glass substrate was placed in a ultrahigh vacuum evaporation chamber which was evacuated to a vacuum of $1\times10^{-10}$ to $3\times10^{-10}$ Torr. While rotating the substrate at room temperature, a magnetic multilayer film of the following composition was formed on the substrate by first depositing a chromium layer of 50 Å thick as an underlying layer, and then depositing a first magnetic layer, non-magnetic metal layer, and second magnetic layer through evaporation. Deposition conditions included a pressure of $1.1\times10^{-9}$ Torr and an energy depositing particles-possessed of 0.06 to 2 eV with a median energy of 0.2 eV. During deposition, a magnetic field having the strength shown in Table 1 was applied in one direction in a plane coextensive with the substrate and parallel to the measuring current flow. The film growth rate for each layer was about 0.3 A/sec.

Table 1 shows the construction of the respective layers. The material and thickness of the respective layers are designated by m1 and t1 for the first magnetic layer, m2 and t2 for the second magnetic layer, and m3 and t3 for the non-magnetic metal layer and reported in the order of (m1, m2, m3) and (t1, t2, t3), respectively. NiFe for m1 stands for the Permalloy composition of 80 wt % Ni-Fe. The number N1 of the first magnetic layers and the number N2 of the second magnetic layers are also reported in Table 1. For those samples wherein N2=N1-1, evaporation was started with the first magnetic layer, both the magnetic layers were alternately evaporated while interposing a non-magnetic metal layer between them, and evaporation was terminated with the first magnetic layer. For those samples wherein N2=N1, the process was the same except that the last evaporation of the first magnetic layer was omitted. For those samples wherein N2=N1+1, evaporation was started with the second magnetic layer and terminated with the second magnetic layer.

The ratio of the magnetization M1 per layer of the first magnetic layers to the magnetization M2 per layer of the second magnetic layers, M1/M2, and the anisotropic magnetic field Hk of the first magnetic layer were determined by preparing special samples for measurement as previously mentioned. A disc sample having a diameter of about 10 mm was used for the measurement of Hk by means of a magnetic torque meter. The results are shown in Table 1.

The samples in Table 1 were heat treated in a vacuum of $10^{-5}$ Torr at 230° C. for 4 hours before the measurement of the following properties. The results are also shown in Table 1.

Minimum resistivity ($\rho_{sat}$)

Each of the samples in Table 1 was cut into a strip of 0.5 mm×10 mm, which was measured for resistance by a four terminal method. For measurement, electric current was longitudinally passed through the strip and an external magnetic field was applied in plane and perpendicular to the electric current and varied from −300 Oe to +300 Oe. From the resistance measurement, minimum resistivity $\rho_{sat}$ was determined.

Maximum MR ratio (maximum MR) and slope of MR curve (MR slope)

Figure 6:
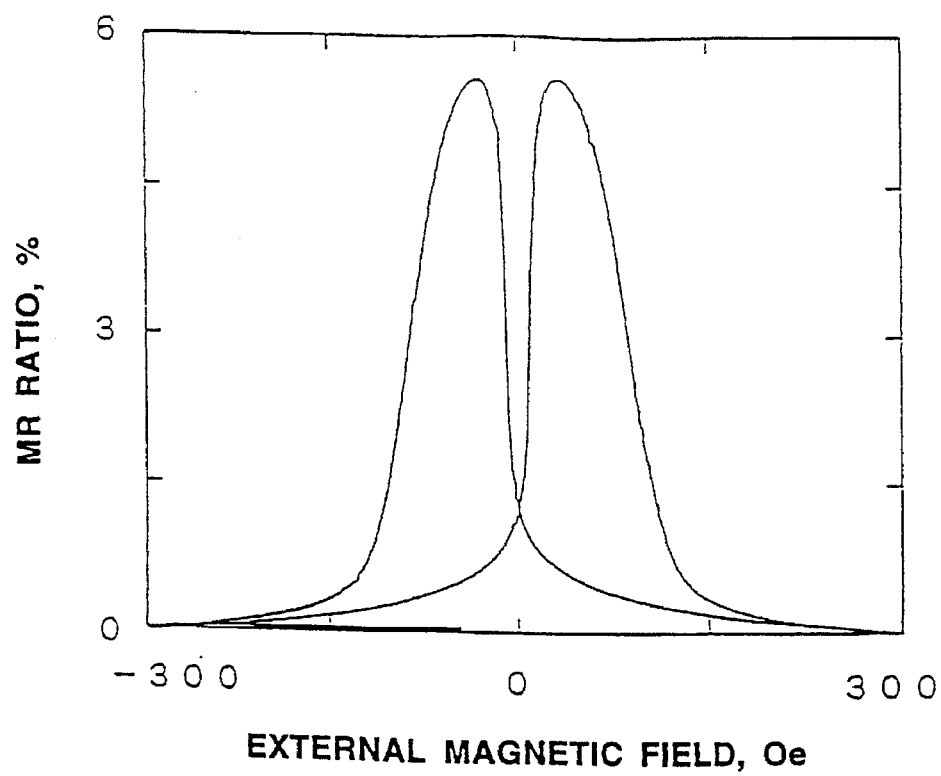
FIG. 6 diagrammatically illustrates an MR curve of a magnetic multilayer film (sample No. 108) according to the invention under a DC magnetic field.

The resistivity $\rho_H$ was measured under an external magnetic field H over the range from −300 Oe to +300 Oe. The percent MR ratio ΔR/R was calculated according to the equation:

$$\Delta R/R = (\rho_H - \rho_{sat})/\rho_{sat} \times 100\%$$

to determine its maximum (maximum MR). An MR hysteresis curve was depicted as shown in FIG. 6 and differentiated to determine a maximum (MR slope) among the magnitudes of differential values within the H range between −10 Oe and 10 Oe, for rise evaluation. The MR curve in FIG. 6 is of sample No. 108 (without heat treatment)

Slope of MR curve at high frequency (high-frequency MR slope)

A percent MR ratio was determined by applying a high-frequency magnetic field at 1 MHz and between −5 Oe and +5 Oe as an external magnetic field, from which an MR curve was depicted and differentiated to determine a maximum (high-frequency MR slope) among the magnitudes of differential values.

TABLE 1

| Sample No. | Layer Material (m₁, m₂, m₃) | Layer Thickness (Å) (t₁, t₂, t₃) | Number of Layers N₁ | N₂ | M₁/M₂ | Magnetic field applied during deposition (Oe) | Hk (Oe) | Heat Treatment (°C.) | High-frequency MR slope (%/Oe) |
|---|---|---|---|---|---|---|---|---|---|
| 101 Comp. | (NiFe, Co, Cu) | (50, 50, 50) | 5* | 5* | 0.75 | 90 | 6.5 | 230 | 0.15 |
| 102 Comp. | (NiFe, Co, Cu) | (50, 50, 50) | 5* | 4* | 0.75 | 90 | 6.5 | 230 | 0.13 |
| 103 Comp. | (NiFe, Co, Cu) | (50, 50, 50) | 4 | 4* | 0.75 | 90 | 6.5 | 230 | 0.15 |
| 104 | (NiFe, Co, Cu) | (50, 50, 50) | 4 | 3 | 0.75 | 90 | 6.5 | 230 | 0.42 |
| 105 Comp. | (NiFe, Co, Cu) | (50, 50, 50) | 3 | 3* | 0.75 | 90 | 6.5 | 230 | 0.21 |
| 106 | (NiFe, Co, Cu) | (50, 50, 60) | 3 | 2 | 0.75 | 90 | 6.5 | 230 | 0.46 |
| 107 Comp. | (NiFe, Co, Cu) | (50, 50, 50) | 2 | 2* | 0.75 | 90 | 6.5 | 230 | 0.20 |
| 108 | (NiFe, Co, Cu) | (50, 50, 50) | 2 | 1 | 0.75 | 90 | 6.5 | 230 | 0.45 |
| 109 Comp. | (NiFe, Co, Cu) | (50, 50, 50) | 1* | 1* | 0.75 | 90 | 6.5 | 230 | 0.05 |
| 110 Comp. | (NiFe, Co, Cu) | (50, 50, 50) | 1* | 2* | 0.75 | 90 | 5.3 | 230 | 0.08 |

*Outside the scope of the invention

As is evident from Table 1, the setting 2≦N1≦4 and N2=N1−1 ensures a very large high-frequency MR slope even after heat treatment. In contrast, despite N2=N1−1, if N1≦5, then the high-frequency MR slope is small as found with sample No. 102 and because of the increased thickness, the magnetic multilayer film is unsuitable as a reading MR head for high density recording media. Also despite 2≦N1≦4, if N2=N1, then the high-frequency MR slope is small as found with sample Nos. 103, 105, and 107

Example 2

Following the procedure of Example 1, magnetic multilayer film samples as shown in Table 2 were prepared. It is noted in Table 2 that for m1, NiFe is Permalloy of the same composition as in Example 1 and NiFeCo is 80 wt % Ni-10 wt % Fe-Co; for m2, CoFe is 80 wt % Co-Fe, CoNi is 90 wt % Co-Ni, CoPt is 90 wt % Co-Pt, and CoSm is 78 wt % Co-Sm; for m3, CuAu is 90 wt % Cu-Au. These samples were evaluated as in Example 1. Evaluation was made on the samples both before and after heat treatment under the same conditions as in Example 1. The results from the samples before heat treatment are reported in Table 3 and the results from the samples after heat treatment are reported in Table 4.

Some of the samples in Table 1 were also evaluated before heat treatment. They are also reported in Tables 3 and 4.

has a maximum MR ratio of 5.8% and a MR slope of 0.51%/Oe and its MR curve exhibits a steep rise near zero magnetic field as shown in FIG. 6. In comparison with the sample of the previously mentioned article (b) having a maximum MR ratio of 4% for N1=N2=3 and 1.2% for N1=N2=1.2%, the present invention provides substantial improvements in MR effect.

As long as the respective magnetic layers and non-magnetic metal layers have a thickness within the scope of the present invention, a great maximum MR ratio and large

TABLE 2

| Sample No. | Layer Material ($m_1$, $m_2$, $m_3$) | Thickness (Å) ($t_1$, $t_2$, $t_3$) | Number of Layers $N_1$ | $N_2$ | $M_1/M_2$ | field applied during deposition (Oe) | Hk (Oe) |
|---|---|---|---|---|---|---|---|
| 108 | (NiFe, Co, Cu) | (50, 50, 50) | 2 | 1 | 0.75 | 90 | 6.5 |
| 201 | (NiFe, Co, Cu) | (40, 40, 50) | 2 | 1 | 0.75 | 150 | 6.2 |
| 202 | (NiFe, Co, Cu) | (30, 30, 50) | 2 | 1 | 0.75 | 90 | 5.9 |
| 203 | (NiFe, CoFe, Cu) | (60, 50, 40) | 3 | 2 | 0.72 | 90 | 6.7 |
| 106 | (NiFe, Co, Cu) | (50, 50, 50) | 3 | 2 | 0.75 | 90 | 6.5 |
| 204 | (NiFe, CoNi, CuAu) | (50, 40, 60) | 3 | 2 | 0.72 | 50 | 5.9 |
| 205 | (NiFeCo, CoSm, Cu) | (50, 60, 45) | 3 | 2 | 0.78 | 90 | 7.6 |
| 206 | (NiFeCo, CoPt, Cu) | (50, 60, 45) | 2 | 1 | 0.71 | 90 | 7.8 |
| 207 Comp. | (NiFe, Co, Cu) | (8, 8, 50)* | 2 | 1 | 0.75 | 50 | 0* |
| 208 Comp. | (NiFe, Co, Cu) | (80, 95, 90)* | 2 | 1 | 0.63 | 90 | 7.1 |
| 110 Comp. | (NiFe, Co, Cu) | (50, 50, 50) | 1* | 2* | 0.75 | 90 | 5.3 |

*Outside the scope of the invention

TABLE 3

| Sample No. | Heat treatment (°C.) | ρsat (μΩ cm) | Maximum MR (%) | MR slope (%/Oe) | High-frequency MR slope (%/Oe) |
|---|---|---|---|---|---|
| 108 | none | 16.8 | 5.8 | 0.51 | 0.46 |
| 201 | none | 15.9 | 5.1 | 0.42 | 0.36 |
| 202 | none | 15.3 | 4.6 | 0.32 | 0.28 |
| 203 | none | 12.4 | 4.8 | 0.39 | 0.31 |
| 106 | none | 16.8 | 5.8 | 0.55 | 0.48 |
| 204 | none | 10.4 | 3.1 | 0.30 | 0.23 |
| 205 | none | 20.6 | 5.1 | 0.41 | 0.32 |
| 206 | none | 19.2 | 5.5 | 0.40 | 0.33 |
| 207 C | none | 10.2 | 0.2 | 0.01 | 0 |
| 208 C | none | 25.2 | 1.1 | 0.11 | 0.03 |
| 110 C | none | 17.6 | 4.2 | 0.19 | 0.13 |

C: comparison

TABLE 4

| Sample No. | Heat treatment (°C.) | ρsat (μΩ cm) | Maximum MR (%) | MR slope (%/Oe) | High-frequency MR slope (%/Oe) |
|---|---|---|---|---|---|
| 108 | 230 | 17.2 | 5.6 | 0.52 | 0.45 |
| 201 | 230 | 16.3 | 5.0 | 0.41 | 0.34 |
| 202 | 230 | 15.5 | 4.3 | 0.30 | 0.28 |
| 203 | 230 | 12.8 | 4.4 | 0.35 | 0.28 |
| 106 | 230 | 17.2 | 5.5 | 0.54 | 0.46 |
| 204 | 230 | 10.9 | 3.0 | 0.30 | 0.24 |
| 205 | 230 | 21.0 | 5.0 | 0.38 | 0.30 |
| 206 | 230 | 19.5 | 5.2 | 0.39 | 0.31 |
| 207 C | 230 | 15.6 | 0.1 | 0 | 0 |
| 208 C | 230 | 27.3 | 0.8 | 0 | 0 |
| 110 C | 230 | 19.3 | 3.6 | 0.14 | 0.08 |

C: comparison

The effectiveness of the invention is evident from Tables 2 to 4. For example, sample No. 108 before heat treatment MR slope were achieved. Good results were obtained when the magnetic layers and non-magnetic metal layers were changed in composition. Apart from the composition shown in the Tables, equivalent results are obtainable from various compositions selected from the previously mentioned preferable composition.

A comparison of Table 3 with Table 4 reveals that the magnetic multilayer films of the invention underwent little deterioration by heat treatment. It is noted that upon heat treatment at a temperature of 350° C., the MR slope was maintained large if the heat treatment was under a pressure of $10^{-7}$ Torr or less. However, if the heat treatment was under a pressure of higher than $10^{-7}$ Torr, the MR slope was substantially reduced with an increasing pressure because the magnetic multilayer film was oxidized by a trace amount of residual oxygen.

An additional magnetic multilayer film was prepared by the same procedure as sample No. 203 except that thickness (t1, t2, t3) was changed to (70, 30, 40). It had a M1/M2 ratio as high as 1.40 and as a consequence, an MR slope which was 30% smaller than that of sample No. 108.

Example 3

Figure 7:
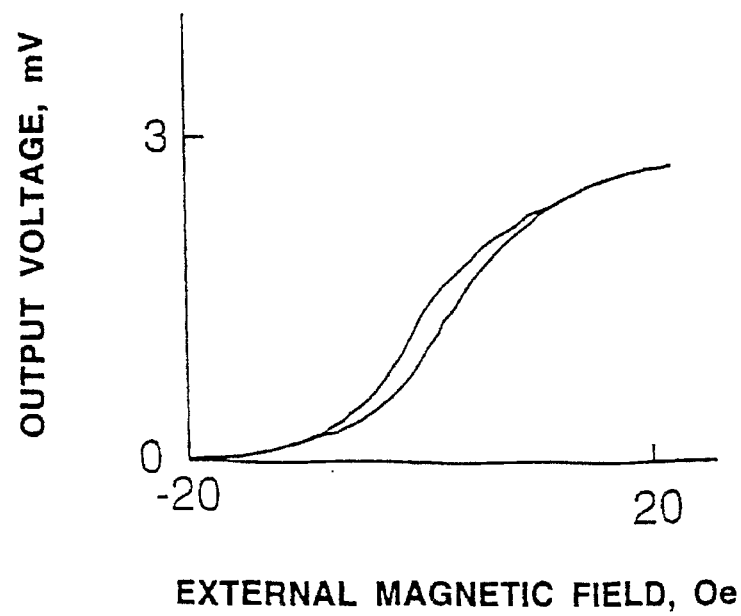
FIG. 7 is a diagram showing the output voltage versus applied magnetic field of a MR head using a magnetic multilayer film as a magneto-sensitive section according to the invention.

On an AlTiC substrate, a shield layer of Sendust and a non-magnetic insulating layer of $Al_2O_3$ were formed and a chromium layer of 50 Å thick was formed as a metal underlying layer. A magnetic multilayer film according to the invention was formed thereon. The film had the same construction as sample No. 108 in Table 1. Deposition conditions were approximately the same as sample No. 108 except for some changes including a vacuum chamber ultimate pressure of $1.3\times10^{-10}$ Torr, a pressure during deposition of $1.2\times10^{-9}$ Torr, a substrate temperature of about 35° C., and a growth rate of 0.2 to 0.3 A/sec. By photolithography, the magnetic multilayer film was patterned to dimensions of 20 μm×6 μm, on which a gold electrode having a track width of 3 μm was formed. Further a non-magnetic insulating layer of $Al_2O_3$ and a shield layer of Sendust were formed thereon to form an MR head. The thus prepared magneto-sensitive section had a structure as shown in FIG. 3. A measuring current of 15 mA was passed across the MR head while an external magnetic field varying between −20 Oe and +20 Oe at 50 Hz was applied. A change of the output voltage of the MR head is depicted in FIG. 7. The MR head produced an output voltage of about 2.8 mV.

For comparison purposes, an MR head was fabricated as above except that the magnetic multilayer film was replaced by a Permalloy film. A measuring current of 15 mA was passed across the MR head while an external magnetic field varying between −20 Oe and +20 Oe at 50 Hz was applied. The MR head produced an output voltage of about 0.8 mV. This means that the MR head having the present invention applied thereto produced a 3.5 times greater output than the conventional MR head.

Example 4

Like the MR heads fabricated in Example 3, yoke type MR heads of the structure shown in FIG. 4 were fabricated using a magnetic multilayer film within the scope of the invention and a Permalloy film in the magneto-sensitive section. On output measurement, the yoke type MR head using the inventive magnetic multilayer film produced a 1.9 times greater output than the yoke type MR head using Permalloy.

Example 5

Like the MR heads fabricated in Example 3, flux guide type MR heads of the structure shown in FIG. 5 were fabricated using a magnetic multilayer film within the scope of the invention and a Permalloy film in the magnetosensitive section. On output measurement, the flux guide type MR head using the inventive magnetic multilayer film produced a 2.8 times greater output than the flux guide type MR head using Permalloy.

Japanese Patent Application No. 227347/1994 is incorporated hereinby reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A magnetic multilayer film comprising a first magnetic layer and a second magnetic layer having a greater coercive force than the first magnetic layer, said first and second magnetic layers being alternately stacked with a non-magnetic metal layer intervening therebetween, wherein the number of the first magnetic layers N1 and the number of the second magnetic layers N2 fall in the range:

$$2 \leq N1 \leq 4 \text{ and}$$

$$N2 = N1 - 1,$$

the first magnetic layer has a thickness t1, the second magnetic layer has a thickness t2, and the non-magnetic metal layer has a thickness t3 wherein $$10 \text{ Å} \leq t1 \leq 80 \text{ Å},$$

$$20 \text{ Å} \leq t2 \leq 90 \text{ Å, and}$$

$$20 \text{ Å} \leq t3 \leq 90 \text{ Å}.$$

2. The magnetic multilayer film of claim 1 wherein each said first magnetic layer has a magnetization M1 and each said second magnetic layer has a magnetization M2 wherein $$0.3 \leq M1/M2 \leq 0.8.$$

3. The magnetic multilayer film of claim 1 wherein said first magnetic layer has an anisotropic magnetic field Hk of 3 to 20 Oe.

4. The magnetic multilayer film of claim 1 wherein said first magnetic layer comprises a magnetic metal containing at least 70% by weight of a composition of the formula:

$$(Ni_xFe_{1-x})_{1-y}Co_y$$

wherein x and y representative of weight ratios are $0.7 \leq x \leq 0.9$ and $0 \leq y \leq 0.3$, said second magnetic layer comprises a magnetic metal containing at least 70% by weight of a composition of the formula:

$$(Co_zNi_{1-z})_wFe_{1-w}$$

wherein z and w representative of weight ratios are $0.4 \leq z \leq 1.0$ and $0.5 \leq w \leq 1.0$, and said non-magnetic metal layer comprises a non-magnetic metal containing at least one element selected from the group consisting of gold, silver, and copper.

5. The magnetic multilayer film of claim 1 wherein said first magnetic layer comprises a magnetic metal containing at least 70% by weight of a composition of the formula:

$$(Ni_xFe_{1-x})_{1-y}Co_y$$

wherein x and y representative of weight ratios are $0.7 \leq x \leq 0.9$ and $0 \leq y \leq 0.3$, said second magnetic layer comprises a magnetic metal containing at least 70% by weight of at least one element selected from the group consisting of cobalt, iron, and nickel and having added thereto at least one element selected from the group consisting of Pr, Pt, Tb, Gd, Dy, Sm, Nd, Eu, and P, and said non-magnetic metal layer comprises a non-magnetic metal containing at least one element selected from the group consisting of gold, silver, and copper.

6. The magnetic multilayer film of claim 1 which upon application of a DC magnetic field, provides a magnetoresistance curve having a maximum slope of at least 0.2%/Oe in a magnetic field in the range between −10 Oe and +10 Oe.

7. The magnetic multilayer film of claim 1 which upon application of an AC magnetic field at a frequency of 1 MHz and an amplitude of 10 Oe over the range between −20 Oe and 20 Oe, provides a magnetoresistance curve having a maximum slope of at least 0.1%/Oe.

8. A method for preparing a magnetic multilayer film as set forth in claim 1 comprising the steps of forming the first magnetic layer, the second magnetic layer and the non-magnetic metal layer, wherein during the step of forming the first magnetic layer, a magnetic field is applied in one in-plane direction of the first magnetic layer.

9. The method of claim 8 wherein the steps of forming the first magnetic layer, the second magnetic layer and the non-magnetic metal layer are by evaporation, particles being deposited possessing an energy of 0.01 to 10 eV.

10. The method of claim 8 wherein the steps of forming the first magnetic layer, the second magnetic layer and the non-magnetic metal layer are by evaporation in an atmosphere of up to $10^{-8}$ Torr.

11. The method of claim 8 which further includes the step of heat treating the resultant magnetic multilayer film at a temperature of up to 300° C.

12. The method of claim 8 which further includes the step of heat treating the resultant magnetic multilayer film at a temperature of up to 400° C. in an atmosphere of up to $10^{-7}$ Torr.

13. A magnetoresistance device comprising a magnetic multi-layer film as set forth in claim 1 as a magneto-sensitive section.

14. The magnetoresistance device of claim 13 which is free of a bias magnetic field applying mechanism.

* * * * *

UNITED STATES PATENT AND TRADEMARK OFFICE
CERTIFICATE OF CORRECTION

PATENT NO. : 5,661,449

DATED : August 26, 1997

INVENTOR(S) : Satoru ARAKI, et al.

It is certified that error appears in the above-identified patent and that said Letters Patent is hereby corrected as shown below:

Column 18, line 56, "20 Oe" should read --+20 Oe--.

Signed and Sealed this

Thirtieth Day of December, 1997

*Attest:*

BRUCE LEHMAN

*Attesting Officer*     Commissioner of Patents and Trademarks